US009826558B2

(12) United States Patent
Felton (10) Patent No.: US 9,826,558 B2
(45) Date of Patent: Nov. 21, 2017

(54) WIRELESS MUTE DEVICE AND METHOD

(71) Applicant: EchoStar Technologies L.L.C., Englewood, CO (US)

(72) Inventor: Mark Felton, Aurora, CO (US)

(73) Assignee: ECHOSTAR TECHNOLOGIES L.L.C., Englewood, CO (US)

( * ) Notice: Subject to any disclaimer, the term of this patent is extended or adjusted under 35 U.S.C. 154(b) by 16 days.

(21) Appl. No.: 14/467,940

(22) Filed: Aug. 25, 2014

(65) Prior Publication Data

US 2016/0057264 A1 Feb. 25, 2016

(51) Int. Cl.
*H04W 76/02* (2009.01)
*H03G 3/34* (2006.01)
*H04W 4/00* (2009.01)
*H04W 84/18* (2009.01)

(52) U.S. Cl.
CPC ............ *H04W 76/02* (2013.01); *H03G 3/348* (2013.01); *H04W 4/008* (2013.01); *H04R 2430/01* (2013.01); *H04W 84/18* (2013.01)

(58) Field of Classification Search
CPC . H04M 1/6058; H04W 4/008; H04R 2430/01
See application file for complete search history.

(56) References Cited

U.S. PATENT DOCUMENTS

| | | | | |
|---|---|---|---|---|
| 2002/0116186 | A1* | 8/2002 | Strauss | G10L 25/78 704/233 |
| 2004/0048569 | A1* | 3/2004 | Kawamura | 455/41.1 |
| 2005/0146444 | A1* | 7/2005 | Allen et al. | 340/825.24 |
| 2009/0109054 | A1* | 4/2009 | Ueda et al. | 340/825.72 |
| 2009/0233590 | A1* | 9/2009 | Sinton | H04B 1/034 455/418 |
| 2010/0064339 | A1* | 3/2010 | Wadey | 725/151 |
| 2012/0014233 | A1* | 1/2012 | Lee | A63B 71/0686 369/30.09 |
| 2012/0307150 | A1* | 12/2012 | Verchykov | H03G 3/342 348/552 |
| 2013/0106586 | A1* | 5/2013 | Vidal et al. | 340/12.22 |
| 2013/0289983 | A1* | 10/2013 | Park | G10L 15/26 704/235 |

* cited by examiner

*Primary Examiner* — Gennadiy Tsvey
(74) *Attorney, Agent, or Firm* — Seed IP Law Group LLP (57) ABSTRACT

A receiving device having a wireless transmission circuit arranged to form a logical communications link between the wireless transmission circuit and an audio output device. The wireless transmission circuit is arranged to communicate audio data to the audio output device via the logical communications link. A wireless reception circuit is arranged to receive user commands, and a first logic circuit is arranged to identify a mute command received via the wireless reception circuit. A second logic circuit is arranged to mute the audio data from transmission to the audio output device while maintaining the logical communications link.

19 Claims, 7 Drawing Sheets

WIRELESS MUTE DEVICE AND METHOD

BACKGROUND

Technical Field

The present disclosure generally relates to audio output devices coupleable to an audio source via a wireless communication protocol such as Bluetooth. More particularly, but not exclusively, the present disclosure relates to a mechanism to mute and unmute the audio output device.

Description of the Related Art

Wireless protocols have been developed to convey information between devices in close proximity to each other. In many cases, the devices are within 10 feet of each other; however, the protocols often permit communication between devices that are up to 30 feet apart or even 300 feet apart. One such protocol conforms to a standardized specification managed by the Bluetooth Special Interest Group (SIG).

Several thousand companies participate in the BLUETOOTH SIG as members. The SIG administers and maintains the standardized Bluetooth protocol specification and also provides qualification testing of devices that wish to bear one or more of the Bluetooth trademarks. Funding for the Bluetooth SIG is provided by patent and trademark license fees paid by companies whose devices comply with the protocol. Bluetooth-compliant devices manufactured by one company are capable of communicating with Bluetooth-compliant devices manufactured by another company.

Fundamentally, the Bluetooth protocol is a low-power, high-speed wireless link technology used to pass data between audio devices (e.g., speakers, headphones), mobile devices (e.g., smartphones, laptops, and other portable equipment), entertainment devices (e.g., stereos, set top boxes, and the like), and other devices with little or no configuration or set up by a user. Bluetooth does not require devices to be positioned within line-of-sight of each other. The Bluetooth protocol uses small, inexpensive variations of existing wireless local area network (LAN) schemes. Often, a single integrated circuit chip is used to implement most or all of the low power logic of a Bluetooth-compliant device.

In some cases, Bluetooth capability is included within equipment, and in other cases, Bluetooth devices are provided as optional extras to add functionality to other devices.

When one Bluetooth-compliant device comes within range of another (e.g., between 10 cm and 100 m) the devices automatically exchange address and capability details. They can then establish a communicative link that transfers data at a specified rate such as 1 megabit per second (Mbps), 2 Mbps, or some other rate. The devices also negotiate or confirm other aspects of the communicative link such as what security (e.g., encryption, verification) and error correction methodologies will be used.

At the circuit level, each Bluetooth-compliant device includes a short-range transceiver. Communication through the transceiver is conducted over at least one data channel and/or up to three voice channels. Each Bluetooth-compliant device has a unique 48-bit address, and the addresses are embedded in packets of data so that data can be efficiently filtered and passed or ignored at the hardware-level. Connections between Bluetooth-compliant devices can be point-to-point or multipoint. A frequency-hopping scheme shared by linked devices provides security as well as protection from radio interference.

Bluetooth-compliant devices are often battery powered. Accordingly, power efficiency may be an important characteristic. The Bluetooth specification addresses power consumption with a "hold" mode, and often, a Bluetooth-compliant device will automatically shift to a low-power mode when traffic volume lessens or stops.

When two or more Bluetooth-compliant devices come into proximity with each other, a network may be instantly formed. The network may be considered a "piconet." A piconet is a plurality of Bluetooth-compliant devices communicatively coupled in an ad hoc fashion. A piconet can be formed between two devices or with more than two devices.

A Bluetooth-compliant device joined in one piconet can also be a member of another network (e.g., another piconet) by means of time multiplexing. In such a scheme, the Bluetooth-compliant device joins multiple networks by suitably sharing time.

A Bluetooth system supports point-to-point and point-to-multi-point connections. When one Bluetooth-compliant device is connected to another such device, the connection is considered to be a point-to-point connection. Alternatively, when a Bluetooth-compliant device is connected to more than one Bluetooth-compliant device (e.g., up to 7 devices), it is a point-to-multipoint connection.

In a network configuration, one Bluetooth-compliant device may act as a master; one or more other Bluetooth-compliant devices may act as slaves. The clock and hopping sequence of the master unit are used to synchronize the other devices (i.e., the slave devices). In addition, in some cases, a 3-bit media access control (MAC) address is used to distinguish between each Bluetooth-compliant device that participates in a communicatively linked relationship.

BRIEF SUMMARY

In accordance with some embodiments described herein, a single remote control device is configured to mute and un-mute a plurality of audio output devices including audio output devices that are coupled to a receiving device or other devices via a wireless communication link. In some cases, the wireless communication link is formed between devices compliant with one or more standardized Bluetooth protocols.

In a first embodiment, a receiving device includes a wireless transmission circuit arranged to form a logical communications link between the wireless transmission circuit and an audio output device, the wireless transmission circuit arranged to communicate audio data to the audio output device via the logical communications link. The receiving device also includes a wireless reception circuit arranged to receive user commands, a first logic circuit arranged to identify a mute command received via the wireless reception circuit, and a second logic circuit arranged to mute the audio data from transmission to the audio output device while maintaining the logical communications link.

In a second embodiment is directed to a Bluetooth transceiver control device formed in a single integrated circuit. The Bluetooth transceiver control device has a first control circuit arranged to form a logical communications link with at least one slave device and a communication circuit arranged to pass audio data to the at least one slave device via the logical communications link. The Bluetooth transceiver control device also has a second control circuit arranged to receive a mute command and a third control circuit arranged to mute the audio data from transmission to the at least one slave device while maintaining the logical communications link.

Another embodiment describes a method to communicate audio data. The method is carried out via several acts including forming a Bluetooth logical communications link to an audio output device via a wireless transmission circuit, communicating audio data to the audio output device via the Bluetooth logical communications link, and receiving a mute command. The method also includes the acts of muting the audio data from communication to the audio output device based on the mute command and maintaining the Bluetooth logical communications link during the muting.

These features with other objects and advantages which will become subsequently apparent reside in the details of construction and operation as more fully described hereafter and claimed, reference being had to the accompanying drawings forming a part hereof.

BRIEF DESCRIPTION OF THE SEVERAL VIEWS OF THE DRAWINGS

Non-limiting and non-exhaustive embodiments are described with reference to the following drawings, wherein like labels refer to like parts throughout the various views unless otherwise specified. The sizes and relative positions of elements in the drawings are not necessarily drawn to scale. For example, the shapes of various elements are selected, enlarged, and positioned to improve drawing legibility. The particular shapes of the elements as drawn have been selected for ease of recognition in the drawings. One or more embodiments are described hereinafter with reference to the accompanying drawings in which.

DETAILED DESCRIPTION

An audio source can wirelessly communicate audio data to an audio output device. Bluetooth is one protocol available for such communication, but another protocol could also be used.

In a Bluetooth protocol, a defined voice channel is often used to send audio data. A voice channel may use, for example, 64 kbps log pulse code modulation (PCM), a continuous variable slope delta (CVSD) modulation voice coding scheme, or some other type of modulation. Typically, lost or errant voice packet data is never retransmitted. Instead, a protocol is chosen with sufficient robustness to handle dropped and damaged voice data. For example, using CVSD modulation, a rising interference level is heard as increased background noise, and even with bit error rates up to 4%, the audio quality is sufficient.

The establishment of a link and the identification of a voice channel generally include initialization acts performed by the communicating devices. That is, the devices identify each other and negotiate particular parameters of the audio data link. Once the initialization process is complete, which can take several milliseconds or longer, audio data is passed between the devices.

Figure 1:
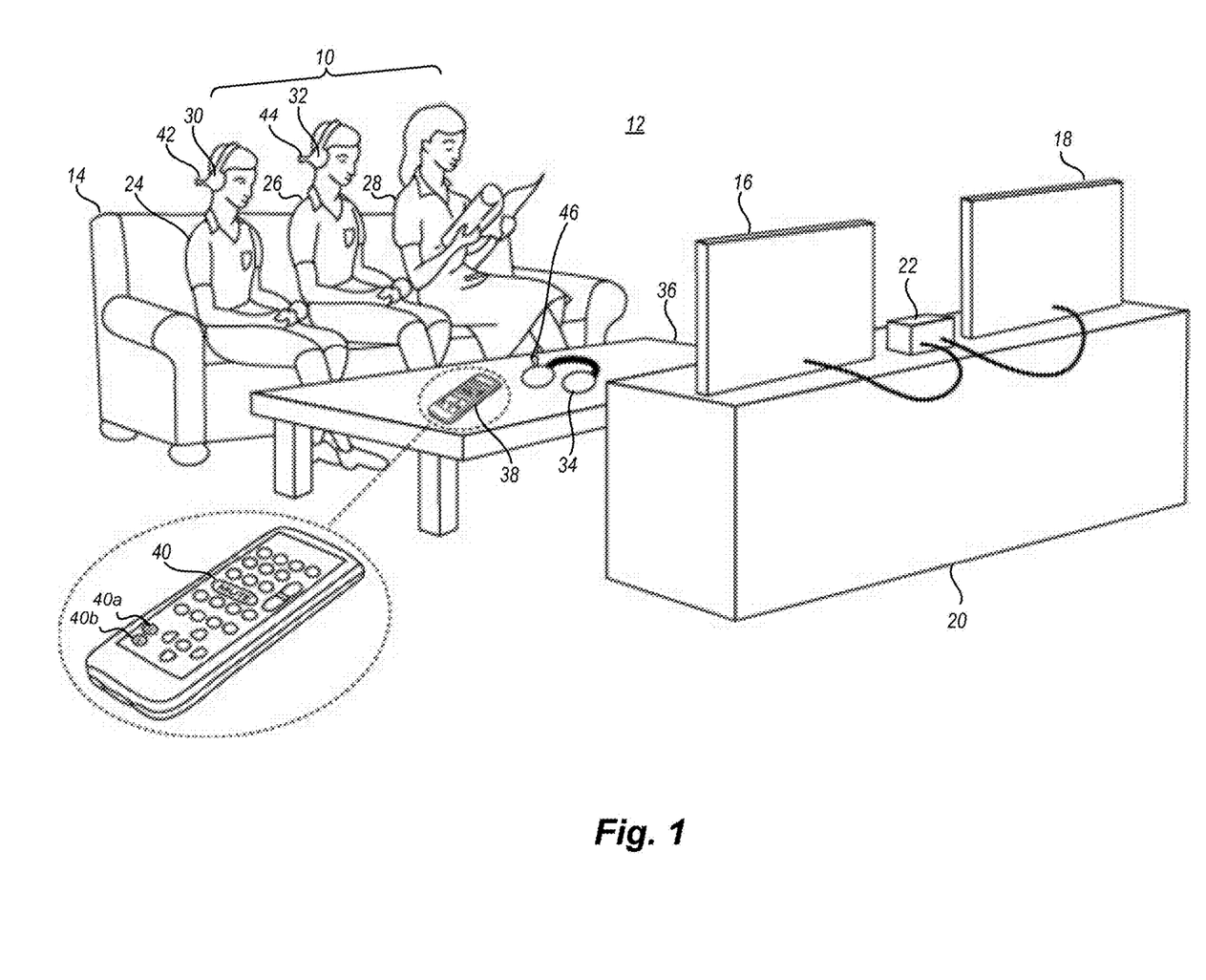
FIG. 1 illustrates three people in a room with at least one receiving device and at least one output device attached to the receiving device.

FIG. 1 illustrates a scenario where audio data is wirelessly communicated between an audio source and a plurality of audio output devices. In FIG. 1, a group of people 10 are in the living room 12 of a home having at least one receiving device and at least one output device attached to the receiving device. More specifically in the embodiment, three people are sitting on the couch 14 in the living room 12. Two television displays 16, 18 are positioned on a first table 20 in view of the three people on the couch 14. A single receiving device 22 on the table 20 provides multimedia data to the two television displays 16, 18.

A first person 24 of the group is wearing a first audio output device 30, i.e., a pair of headphones. A second person 26 of the group is wearing a second audio output device 32. A third person 28 is reading a book, and a third audio output device 34 is lying on a second table 36, next to a remote control device 38. The remote control device 38 optionally includes mute button 40, which is generally used to toggle a mute function on and off. The remote control device 38 may also include other optional buttons which can be used independently or in combination to provide additional commands to the receiving device 22, the first and second television displays 16, 18, or to other devices. Two of the optional buttons, a pound ("#") button 40a and an asterisk ("*") button 40b are illustrated in FIG. 1, though it is recognized that many other buttons and labels can be used. Each of the audio output devices 30-34 may also optionally include a mute button 42-46 to mute and un-mute the audio signal directed to the respective audio output device.

The embodiment and configuration of the living room 12 in FIG. 1 is illustrative of a wide variety of scenarios. The first person 24 may be watching programming displayed on the first television display 16 or the second television display 18. The first and second television displays 16, 18 may be presenting the same programming or they may be presenting different programming. The audio content communicated to the first audio output device 30 may correlate with programming presented on the first television display 16, the second television display 18, the receiving device 22, or some other source (not shown). Along these lines, the second person 26 wearing the second audio output device 32 (i.e., headphones), may also be viewing and hearing programming content from any respective source or sources including the first television device 16, the second television device 18, the receiving device 22, or some other source (not shown).

The third person 28 in the living room 12 of FIG. 1 is situated different. Unlike the first person 24 and the second person 26, the third person 28 is not currently associated with an audio output device even though audio output device 34 is available. The third person 28 is illustrated reading a book, but many other activities are also contemplated.

In one situation, there is silence in the living room 12 because both the first person 24 and the second person 26 are listening to audio via their respective audio output devices 30, 32, and no other audio is being directly output from a speaker or other audio producing device. In another situation, both the first person 24 and the second person 26 are listening to the same audio content via audio output devices associated with the first television display 16 while the third person 34 is listening audio associated with the second television display 18. In this situation, audio is directly output (e.g., via a speaker) from the receiving device 22 or from the second television display 18, and the third person 28 does not need an audio output device. Still other situations contemplate additional variations of direct audio, wireless audio, silence, displayed programming content, and the like.

A shortcoming with conventional wireless audio technology has been identified. A solution to the shortcoming and several variations thereof has been discovered.

In situations that arise in the living room 12 of FIG. 1, it is often desirable to mute one or more audio sources. A remote control device 38 often has a mute button, but the conventional mute button is only able to affect one expressly matched device. For example, pressing the mute button of a television remote control may temporarily stop audio emanating from the speaker of the associated television set, but the mute control signal is not available outside of the television set. As another example, pressing the mute button of a remote control associated with a certain receiving device will also only mute the audio from one device coupled to the receiving device. It is now recognized that in many cases, it is desirable to synchronously mute two or more devices with a single remote control.

In one case, for example, the first person 24 in FIG. 1 has a desire to mute audio. The first person 24 may be hearing impaired or maybe not. The second person 26 or the third person 28 may be hard of hearing or not. In one of these circumstances, if there is more than one device producing audio, it would be desirable to mute all of the devices with a single mute control. The single mute control may be any of the optional mute buttons 40-46 of FIG. 1, or alternatively, all of the optional mute buttons 40-46 may operate to accomplish the same goal: to mute more than a single device. A mute control that can control a mute feature for two or more devices has associated logic configured to receive the command and concurrently mute all of the audio producing devices.

In some wireless protocols, Bluetooth for example, data communication includes a first initialization act to link devices together, and a subsequent act to send data. Establishing the link, which may also be known as a virtual pipe, virtual channel, logical communications link, or the like, may take between several milliseconds and several seconds. The initialization time is often perceptible to a user. Once the Bluetooth-compliant devices are linked, however, the audio data is communicated quickly and efficiently. For this reason, users tend to tolerate the time needed to initialize Bluetooth-compliant devices.

An example where users tolerate the initialization time of Bluetooth-compliant devices involves a mobile device (e.g., a cellphone) and a headset. When the user makes a call, the mobile device and the headset are initialized to form a link, and then once linked, the call is established and audio data is communicated. Beneficially, the link can be established once and then one or more telephone calls can be made with favorable results because the communication of audio data is fast, reliable, and efficient. If the initialization of the Bluetooth link takes a second or two, a user tolerates the delay as a necessary aspect of using the headset. Alternatively, if the link had to be re-initialized frequently, the constant delay due to initialization time would be unacceptable.

Figure 2:
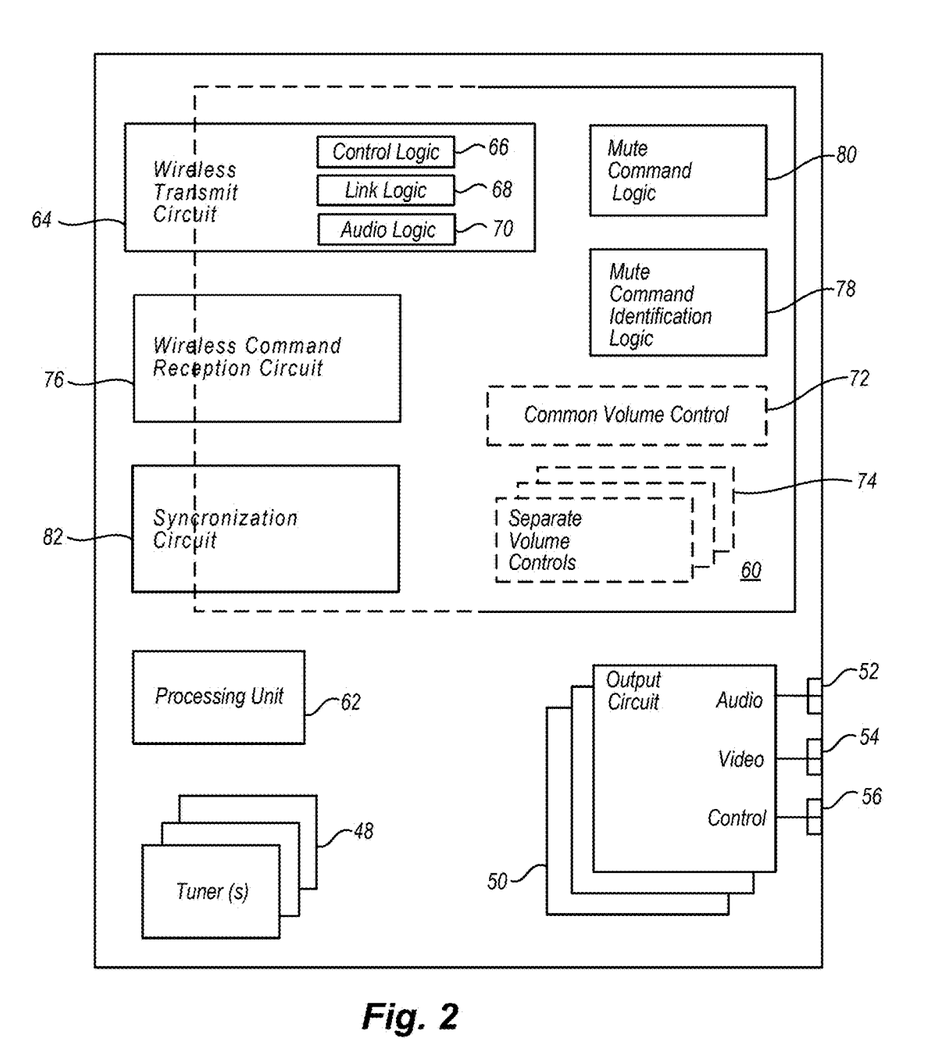
FIG. 2 is the receiving device of FIG. 1 in more detail.

FIG. 2 is the receiving device 22 of FIG. 1 in more detail. The receiving device 22 may be interchangeably referred to as a "television converter," "receiver," "set-top box," "television receiving device," "television receiver," "television recording device," "satellite set-top box," "satellite receiver," "cable set-top box," "cable receiver," and/or "television tuner." Accordingly, the receiving device 22 may be any suitable converter device or electronic equipment that is operable to receive programming. Further, the receiving device 22 may itself include user interface devices, such as buttons or switches, and the receiving device 22 may be embodied in a single unit or in multiple units. For example, the receiving device may have cooperative logic located in the remote control 38 (FIG. 1), the television displays 16, 18 (FIG. 1), or elsewhere. The remote control 38 (FIG. 1), which is optional, is operable in some cases to control some or all of the receiving device 22, the television displays 16, 18, and other user devices. The remote control may be embodied as a standalone device. Alternatively, or in addition, a remote control device may be embodied within a tablet computer, within a mobile communication device (e.g., a smartphone), or as part of some other computing device.

The television displays 16, 18 of FIG. 1, which are coupled to the receiving device of FIG. 2, may be conventional television sets having one or more tuners. Alternatively, the television displays 16, 18 may be video output devices configured to receive multimedia data. The devices may be computing devices with video output capability such as laptop computers, desktop computers, or tablet devices. In the embodiment of FIG. 1, the television displays 16, 18 are wired to the receiving device 22, but wireless communications are also considered. More or less than two television displays 16, 18 may be present, and more than a single receiving device 22 may also be present.

Other examples of television displays 16, 18 may also include a digital video recorder (DVR), a compact disk (CD) device, a game system, or the like. Television displays 16, 18 may employ a display, one or more speakers, or other output devices to communicate audio, video, control information, and/or other data content to a user. In many implementations, one or more television displays 16, 18 are placed in or near a home, but the television displays 16, 18 and associated receiving devices 22 may also be located in businesses, government offices, public areas, and in other places.

Turning back to the receiving device 22 of FIG. 2, one or more tuners 48 receive input from a programming source. The programming source may be a satellite front-end, a cable television front-end, a digital video recorder (DVR), digital video disk (DVD), an electronic storage device, a computing device, or some other programming source. Examples of programming include movies, television shows, sporting events, and the like.

A tuner 48 selects programming that will be passed out of the receiving device 22 via one or more output circuits 50. Specific output ports including an audio port 52, a video port 54, and a control information port 56 are illustrated, though other ports and combinations of ports are also considered. The output circuit 50 may prepare output data for passage via the audio port 52 and video port 54 respectfully arranged in conformance with a high-definition multimedia interface (HDMI), a DISPLAYPORT interface, a video graphics array (VGA) interface, a digital visual interface (DVI), a serial interface, a parallel interface, or another interface. The output circuit 50 may prepare control data for passage via the control port 56 according to a communications protocol such as USB, IEEE 1394, IEEE 802.3, IEEE 802.11, IEEE 802.15, RS-232, RS-422, RS-485, Infrared, $I^2C$, SPI, PCI, CAN, or some other protocol. The control port 56 may conform to any serial, serialized, or parallel communications protocol. In many cases, the control port 56 is formed with a traditional serial port driven by a universal asynchronous receiver/transmitter (UART). In other cases, the control port 56 is formed with a set of general purpose I/O (GPIO) pins desirably configured as data pins, clock pins, control pins, power pins, or the like.

The receiving device 22 includes at least one memory 60, which is accessible by at least one processing unit 62. The memory 60 is configured to store software that directs the at least one processing unit 62.

Memory 60 comprises any combination of non-transitory volatile and non-volatile computer-readable media for reading and writing. Inside memory 60, a collection of software instructions executable by the processing unit 62 operatively configures hardware and other software in the receiving device 22 to carry out the functions of the receiving device 22. The memory 60 may include a file system, one or more database systems, or any other mechanisms known in the art for storing information. The memory 60 and in the alternative or in addition the processing unit 62 may be implemented using distributed computing techniques.

Memory 60 is illustrated with both solid and dashed lines. The illustration of memory 60 indicates that functional logic features of the receiving device 22 may be carried out with hardware circuitry, with software, or with a combination of hardware circuits and software.

A wireless transmission circuit 64 is included in the receiving device 22. The wireless transmission circuit 64 includes control logic 66, link logic 68, and audio logic 70.

The wireless transmission circuit 64 may conform to a standardized Bluetooth protocol. A transceiver (i.e., a communication circuit) in the wireless transmission circuit 64 is configured to communicate with a corresponding transceiver using a mutually known frequency. Bluetooth-compliant devices, for example, communicate using short-wavelength ultra-high frequency (UHF) signals in the 2.4-2.485 GHz range.

The control logic 66 is configured to control the operations of the wireless transmission circuit 64. The control logic 66 keeps track of known devices that the receiving device 22 will form communicative links with, timeouts for communications, addressing information, and the like. The control logic 66 also cooperates with other logic modules and controls of the receiving device 22.

Link logic 68 forms and maintains a logical communications link with one or more other devices such as an audio output device. Initial data is passed to identify addressing information of the devices that will communicate. Frequency information is also passed or otherwise negotiated. The frequency information may include identification of a frequency-hopping pattern. In some embodiments, the link logic 68 is arranged to concurrently form a separate logical communications link with each of a plurality of audio output devices.

The link logic 68 maintains a status of communications-readiness with one or more other devices. For example, one state of the link logic 68 may include a "ready-to-link" state. Another state may include a "linked" state. Two more states may include a "ready-to-send-data" state and a "pause" state. Other states may also be defined.

In some cases, status states may be mutually exclusive such that a status variable stored in memory can maintain only a single state at a time. For example, each state may be represented by an integer, and the status variable can store one integer at a time. Alternatively, different status states may coexist. For example, one or more bits of a status variable stored in memory can be designated for each possible state. The assertion or lack thereof of particular bits indicates one or more status states of the wireless transmission circuit 64. In one example of bit-wise storage, Bit 0 of the status variable represents the device is "ready-to-link," bit 1 represents the device is "linked," bit 2 represents the device is "ready-to-send-data," and bit 3 represents data communications are "paused." In the bit-wise embodiment, multiple status indicators can be concurrently set or cleared, thus, the wireless transmission circuit 64 can maintain a status of both "linked" and "ready-to-send" data; the wireless transmission circuit 64 can be later suspended so that "paused" bit is concurrently asserted too. Other circumstances, bit positions, states, and the like are also contemplated.

The link logic 68 may direct and maintain peer-to-peer relationships, one-to-many relationships, or many-to-many network relationships. In some cases, the link logic 68 performs functions as a master or as a slave, and one or more cooperative devices (e.g., audio output devices) perform complementary functions as a slave or as a master.

Audio logic 70 is arranged to generate and direct packets of audio data for communication to one or more linked devices. The audio packets produced by the audio logic 70 are communicated to an audio output device via a logical communications link. In addition to the audio data itself, the audio packets may include further information such as bit density, playback speed, playback volume, and other parameters. In addition, the audio packets may include synchronizing information cooperative with associated video information. For example, in some cases, the audio data is associated with television programming. The audio packet data may include certain synchronization information so that a person speaking in the video will have coordinated video and audio information.

The wireless transmit circuit 64 may be provided in one or more embodiments. For example, in some cases the wireless transmit circuit 64 is formed in a single integrated circuit. The integrated circuit may include only the wireless transmit circuit 64 functionality, or the integrated circuit may include other circuitry. In one embodiment, a single wireless transmit circuit 64 in a single integrated circuit conforms to a Bluetooth protocol.

In FIG. 2, the control logic 66, the link logic 68, and the audio logic 70 are illustrated as contained within the wireless transmit circuit 64. Alternatively, one or more of these logic modules may be separate and distinct from the wireless transmit circuit 64. In these cases, the communication circuit includes various interfaces. For example, when the audio logic 68 module is external of the wireless transmit circuit 64, the wireless transmit circuit 64 may include an audio interface to receive audio data from the audio logic 68. As another example, when the control logic 66 module is external of the wireless transmit circuit 64, the communication circuit may include a serial port or some other interface to receive control information from the control logic 66 module.

The receiving device 22 may form logical communication links with a plurality of audio output devices. In such cases, the receiving device 22 may be a master device, and the audio output devices may be slave devices. Alternatively, all of the devices may equally participate in a network arrangement. In some embodiments, each audio output device may have its own volume control. In this or other embodiments, a common volume control may direct the volume that will emanate from two or more of the audio output devices. The audio logic circuit 70 may be used to generate or provide the volume information to the audio output devices.

An optional common volume control 72 module may be included in the receiving device 22. An optional plurality of separate volume control 74 modules may be included in the receiving device 22. The common volume control 72 and separate volume controls 74, when included, are coupled to the audio logic 70. If a user raises or lowers volume, relevant command signals are passed from the particular volume control to the audio logic 70 such that audio data having the desired audio volume characteristics will be passed to one or more audio output devices. In one example, referring to FIG.

1, the group of people 10 may each be listening to audio from one of the audio output devices 30, 32, from one or more of the television displays 16, 18, or even from the receiving device 22. In cases such as this, sound from one audio output device (e.g., headphones) and sound from a television display 16, 18 may share common volume control or may have different volume controls. The shared or separate volume controls may be distributed amongst the different devices in other ways as well.

The receiving device 22 includes a wireless command reception circuit 76. The wireless command reception circuit may receive information from a device such as remote control 38 (FIG. 1). In many cases, the wireless command reception circuit 76 receives infrared (IR) signals from the remote control 38. In other cases, the wireless command reception circuit 76 may be based on some other wireless communication technology such as ZigBee, Z-Wave, and the like.

The wireless command reception circuit 76 may be configured to receive command information from one remote control in some embodiments. In other embodiments, the wireless command reception circuit 76 is configured to receive command information from two or more remote control devices. In this way, a single receiving device 22 may provide a control interface that cooperates with a one remote control device associated with the receiving device 22, with another remote control associated with one of the first television display 16, with yet one more remote control device associated with the second television device 18, and so on. In these cases, certain commands such as volume controls may be received and processed by the common volume control 72 or separate volume controls 74 for desirable control of audio output.

The wireless command reception circuit 76 is associated with a mute command identification logic 78 module and a mute command logic 80 module. The wireless command reception circuit 76 is arranged to receive user commands. The mute command identification logic 78 is arranged to identify a mute command or a combination of mute commands received via the wireless command reception circuit 76. The mute command logic 80 is arranged to mute the audio data from transmission to one or more audio output devices while the logical communications links are maintained.

In some embodiments, a mute operation is associated with one mute command that toggles a mute feature "on" and "off." In other embodiments, a mute operation is associated with separate and distinct mute and un-mute commands. The same input control (e.g., a mute button 40) in some cases provides both mute and un-mute commands. Alternatively, a remote control device may have physically separate mute and un-mute input controls (e.g., buttons). In one embodiment, the remote control 38 of FIG. 1 produces a first mute command signal when a user presses the optional mute input control 40. In the same or other embodiments, the first, second, and third audio output devices 30-34 optionally include their own mute buttons 42-46, respectively.

In still other cases, one or more mute-related command signals are produced based on combinations of input controls. That is, in some embodiments, when a user presses a mute button 40 in conjunction with a pound ("#") button 40a, a first mute control signal is produced. When the user presses the mute button 40 in conjunction with an asterisk ("*") button 40b, a second mute control signal is produced. The button presses are consecutive in some configurations and the order of button presses may or may not be important. The button presses are concurrent in other operations. In one embodiment, for example, when a user presses the mute button 40 in conjunction with the asterisk button 40b, the audio signal to the first, second, and third audio output devices 30, 32, 34 is muted. In addition, when the user presses the mute button 40 in conjunction with the pound button 40a, audio to the first and second television displays 16, 18 is muted. Other operations along these lines are also contemplated.

The wireless command reception circuit 76, the mute command identification logic 78, and the mute command logic 80 cooperate with the logic modules of the wireless transmit circuit 64 and a synchronization circuit 82.

One feature of the synchronization circuit 82 is to provide a common, synchronized mute control. With respect to the living room 12 of FIG. 1, for example, when a mute command 40-46 on remote control 38 or audio output device 30-34 is pressed, the audio output from all devices is muted. That is, if any of the audio output devices 30, 32, 34 is receiving and outputting audio data, the audio data is prevented, suspended, or otherwise muted. Concurrently, if any of the television display devices 16, 18 or the receiving device 22 is outputting audio data, the audio data is prevented, suspended, or otherwise muted.

The muting feature can be carried out in various ways. In one embodiment, when a mute operation is enabled, the audio data is altered (i.e., modified) to simulate silence. The simulation of silence may be carried out in some cases by setting all audio data to zero or null. The simulation of silence in other cases is carried out by setting the data in audio packets to a baseline level or some other simulation of quiet. In still other cases, the audio data is simulated as silence by setting the volume control in the data packets to a reduced level. The simulation of silence in these cases does not suspend the transmission of audio data packets. Instead, audio data packets are delivered to the respective audio output device, and the processing by the audio output device results in low volume or silence as perceived by an associated user.

In other embodiments, the muting feature is carried out by suspending the audio data from communication to the one or more audio output devices after the mute command is received and identified. When an un-mute command is received and identifies, the suspension of audio data is ended, and the transmission of audio data to the audio output devices resumes. In these cases, when the mute feature is enabled, the logical communications link is maintained, but no audio data is communicated.

In still other embodiments, the muting feature is carried out by passing a control signal to one or more of the audio output devices after the mute command is received an identified. In these circumstances, the audio output device locally mutes its audio output. Embodiments such as these take advantage of traditional muting features in new ways. For example, in the living room 12 of FIG. 1, a mute command received by the receiving device 22 may be processed in multiple ways. The audio data in this case may be suspended to the first audio output device 30 and second audio output device 32 while maintaining the logical communications link. Concurrently, a mute control signal may be serially or otherwise passed to the first and second television display devices 16, 18 via the control output port 56.

Another feature of the synchronization circuit 82 coordinates the output of audio data amongst all of the relevant, coupled audio output devices. It has been recognized that the audio output devices are often used asynchronously. For example, FIG. 1 illustrates a first person 24 wearing a first audio output device 30, which may be embodied as a Bluetooth-compliant pair of headphones. A circumstance may occur wherein audio is already muted from the first and second television display devices 16, 18 at the time when the first person 24 enables the first audio output device 30, which causes the logical communications link to be formed. In this circumstance, the first audio output device 30 would not have received a mute command or may not know to mute the audio data. The synchronization circuit 82 is configured to coordinate the mute feature amongst all of the audio output devices.

In some embodiments, the mute logic in the receiving device 22 recognizes and maintains a global "muted" and "un-muted" status. In this way, even if audio output devices enter or drop communications with the receiving device 22, the mute command remains synchronized so that all audio output devices either pass audio data or mute audio data.

In other embodiments, the mute logic of the receiving device coordinates user input to assist the synchronization operation. User assistance may be used when multiple sources (e.g., two or more receiving devices) are providing audio data. User assistance may also be used when audio output devices become un-synchronized for any other reason. The un-synchronized state includes circumstances when pressing a mute button 40 on a remote control 38 mutes audio from some devices, and un-mutes audio to other devices. A second press of the mute button 40 results in the muted devices re-enabling audio data output and the un-muted devices disabling (i.e., muting) audio data output. This Ping-Pong operation of the un-synchronized state results in some audio output at all times, and fails to result in a universal muted condition.

In still other embodiments, the synchronization circuit may cooperate with the wireless command reception circuit 76, the mute command identification logic 78, and the mute command logic 80 to receive, identify, and process multi-key control signals input from the remote control 38. That is, the particular modules can be configured to receive and interpret the multiple key presses from the mute button 40, the pound ("#") button 40*a*, the asterisk ("*") button 40*b*, and other buttons. The generation and interpretation of these commands can be configured to allow independent control of mute operations to one device or cooperative control of mute operations amongst two devices, three devices, or many devices.

The circuits and logic associated with memory 60 may be separated or combined in any way. It is understood that features and functionality described in association with one circuit or logic module may in fact be provided as illustrated or the features and functionality may be provided in a single circuit, single module, or some other group of circuits and modules.

Figure 3:
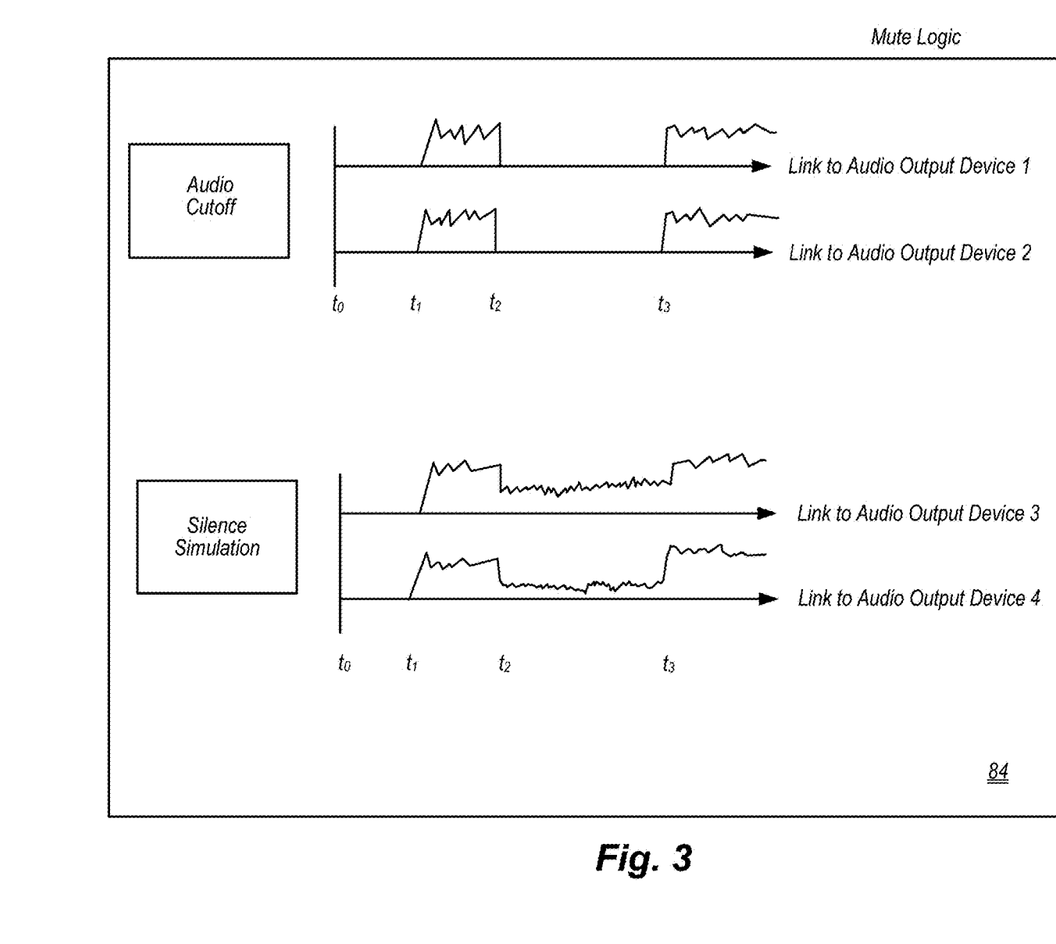
FIG. 3 illustrates embodiments of mute logic in the receiving device of FIG. 2.

FIG. 3 illustrates embodiments of mute logic 84 in the receiving device 22 of FIG. 2. The mute logic 84 is provided by some parts or all parts of the wireless transmit circuit 64, control logic 66, link logic 68, audio logic 70, the wireless command reception circuit 76, mute command identification logic 78, mute command logic 80, and the synchronization circuit 82.

In FIG. 3, the mute logic may be implemented as either or both of an audio cutoff feature or a silence simulation feature. With respect to the audio cutoff feature, at time $t_0$, logical communications links are formed between the receiving device 22 (FIG. 2) and two audio output devices. At $t_1$, the receiving device 22 begins to pass audio data as packets or in some other form to the output devices, and at $t_2$, a mute command is received, identified, and processed.

The output of audio data stops at $t_2$, but the logical communications link is maintained. At $t_3$, an un-mute command, which may merely be a second mute command or may be a different command altogether, is received, identified, and processed. The un-mute command results in audio data once again being passed to the relevant audio output devices via the logical communications link.

It is recognized that links to more or fewer than two audio devices can be formed. It is also recognized that the formation of links need not be at the same time, and the passage of audio data need not begin at the same time. The volume of the audio data can be different to different audio output devices, and the audio output devices may control volume locally and independent from the receiving device 22. Furthermore, the content of the audio data passed to one device may be unrelated to the content of audio data passed to another device. For example, as in FIG. 1, a first person 24 may be hearing audio data from a movie displayed on the first television display 16, and a second person 26 may be hearing audio data from a sporting event displayed on the second television display 18.

The silence simulation feature of FIG. 3 bears similarities to the audio cutoff feature. The common aspects of link formation at $t_0$, audio output beginning at $t_1$, and mute command reception at $t_2$ are not discussed for brevity. It is apparent at $t_2$, however, that audio data of a lower volume begins at $t_2$ and ends at $t_3$. Over the logical communications link to audio output device 3, the simulated silence data may be uniform, or moderately varying to simulate a more real silence as perceived by a particular user. Over the logical communications link to audio output device 4, the simulated silence data is at a lower volume.

Figure 4:
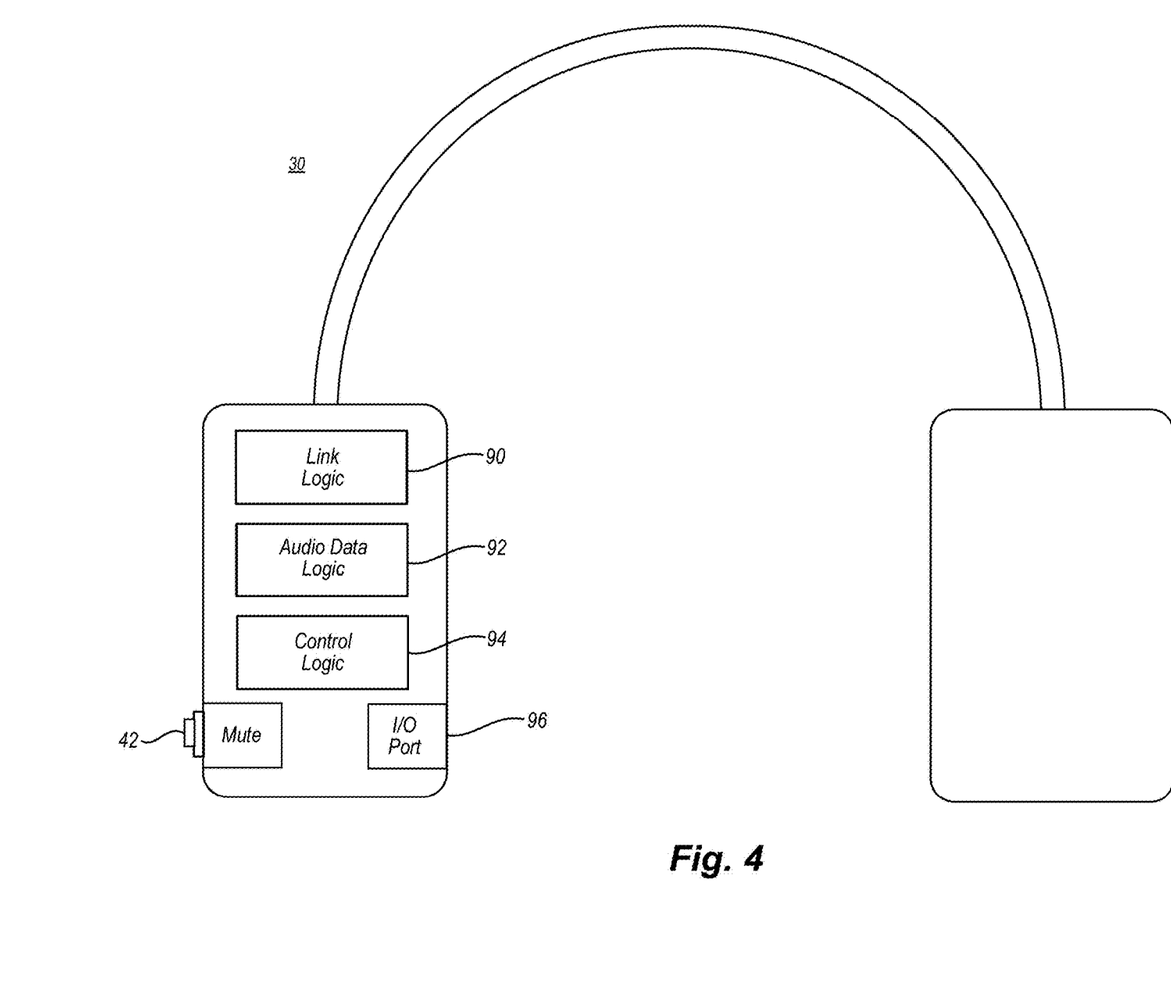
FIG. 4 is the first audio output device of FIG. 1 in more detail.

FIG. 4 is the first audio output device 30 of FIG. 1 in more detail. The first audio output device 30 is illustrated as a headset, which is also referred to as a pair of headphones or by other similarly descriptive names. The audio output device 30 includes link logic 90, audio data logic 92, control logic 94, and an input/output (I/O) port 96. Other circuitry and modules such as a processing unit, memory, and power logic are not shown for simplicity.

The I/O port 96 may be an electronic communications port directly connectable to another electronic device. The I/O port 96 may be wired or wireless. For example, the I/O port 96 may conform to a multimedia protocol such as HDMI, DVI, or VGA. The I/O port 96 may conform to another type of multimedia or flexible communications protocol such as USB, IEEE 1394, IEEE 802.3, IEEE 802.11, IEEE 802.15, RS-232, RS-422, RS-485, Infrared, $I^2C$, SPI, PCI, CAN, or some other protocol. In fact, the I/O port 96 may conform to any serial, serialized, or parallel communications protocol. In many cases, the I/O port 96 is formed with a traditional serial port driven by a universal asynchronous receiver/transmitter (UART). In other cases, the I/O port 96 is formed with a set of general purpose I/O (GPIO) pins desirably configured as data pins, clock pins, control pins, power pins, or the like.

In some cases, the first audio output device 30 is a master device that governs communications with one or more slave devices. In other cases, the first audio output device 30 is a slave device that communicates with a master device. The audio output device 30 may operate in a peer-to-peer relationship with another device, or the audio output device 30 may operate as part of a network. In some embodiments, the audio output device 30 operates in accordance with one or more standardized Bluetooth protocols.

In some cases, the link logic 90 of the audio output device 30 cooperates with the link logic 68 of the receiving device 22. Correspondingly, the audio logic 92 cooperates with the audio logic 70 of the receiving device 22, and the control logic 94 cooperates with the control logic 66 of the receiving device 22. The link logic 90 is configured to maintain a logical communications link even when no audio data or muted audio data is passed via the audio logic 92. In addition, or in the alternative, the logical communications link may also be maintained if a mute command is passed from a receiving device 22 through the control logic 94.

In many embodiments, the audio output device 30 is Bluetooth-compliant, battery powered device. In these devices, power efficiency is often an important characteristic. At least some Bluetooth specifications address power consumption with a "hold" mode, and the audio output device 30 may automatically shift to a low-power mode when traffic volume lessens or stops. A similar feature may be used to implement the mute feature as described herein. That is, a mute condition may be automatically detected, passed via the control logic 94, passed via the I/O port 96, or recognized in a different way. In this case, a new feature may be implemented to maintain the logical communications link while the mute command is active.

Reference is now made to the devices of FIGS. 1-4 as various non-limiting scenarios are presented.

In one scenario some people wish to watch television programming in a room while another person is engaging in a non-television activity in the same room. The people watching the television programming do so with wireless (e.g., Bluetooth) headsets while the audio on a television display device is turned all the way down to avoid disturbing those person not watching.

In another scenario one person is hearing impaired and other people are not impaired. The group desires to watch television programming. The hearing-impaired person needs greater volume so chooses to use a wireless headset.

In yet another scenario, two television display devices are in the same room tuned to different channels. Watching television programming is done using wireless headsets to avoid the sound from the two tracks mixing.

In each of these three scenarios, people may wish to mute the sound during commercials or for other reasons.

Several different implementations have been described. One implementation is an integrated approach, which uses a satellite television display device (TV) remote control or a cable TV remote control to mute the wireless device. In the integrated approach, the wireless headset audio data originates in a receiving device (e.g., a set top box (STB)). The mute for the wireless headset is provided by the remote control used to control both the receiving device and a TV. Conventional remote controls quiet the TV when the mute button is pressed, but not the wireless headset. The integrated approach makes it possible to mute both devices with the same button.

In the scenario where people are watching TV while another person is reading a book, the audio on the TV can be tuned down all the way and the mute button can be used to block audio on the wireless headset, for example during commercials.

In the scenario where a hearing-impaired person is watching TV with a non-hearing-impaired person, the mute will silence both the TV and the wireless headset at the same time. Both people will experience audio in the same way.

Blocking the wireless headset audio is done in the receiving device. Pressing the mute button can cause a signal to be passed to both the TV and to the receiving device. The receiving device can block wireless headset audio in software, by sending a control signal to the wireless headset, or via other mechanisms.

In some embodiments, a mute button is built into the wireless headset. The user reaches up and presses the button, which allows a single remote to silence all devices. In other embodiments, a separate wireless headset remote button is included on a remote control device. Silencing all devices includes pressing a first mute button directed to the receiving device and a second mute button directed to the wireless headsets.

Synchronization is also addressed. It is possible for the wireless headset and a TV to be enabled out of sync. In this case, pressing a mute button a first time turns off one device and turns on the other device. A second press reverses the results. One way to implement synchronization is via a user input screen that displays on the TV and guides the user through a synchronization procedure. For example, with audio data being output from on both the TV and the wireless headset, the user presses the mute button, which synchronizes all of the devices. If an unsynchronized state is detected, a popup output may appear on the TV display thereby allowing a resynchronization process to take place.

One aspect generates mute capability from the sound source (i.e., a receiving device) rather than at the sound receiver (i.e., the wireless audio output device). An advantage of this approach is the synchronization of a mute operation of the wireless audio output device with the mute operation of a corresponding receiving device. The approach permits a universal remote control to operate television display device functions, receiving device functions, and wireless audio output device functions. A user now has a single point of control.

In some embodiments, the mute control solutions described herein may be implemented in hardware, software, or a combination of hardware and software.

In one embodiment, the mute control solutions described herein initiates multiple control mechanisms in a single remote control button press. The remote control directs one signal to the TV so it mutes itself, and the remote control sends one signal to the STB, which then blocks audio to the wireless audio output device having no self-contained mute capability.

Figure 5A:
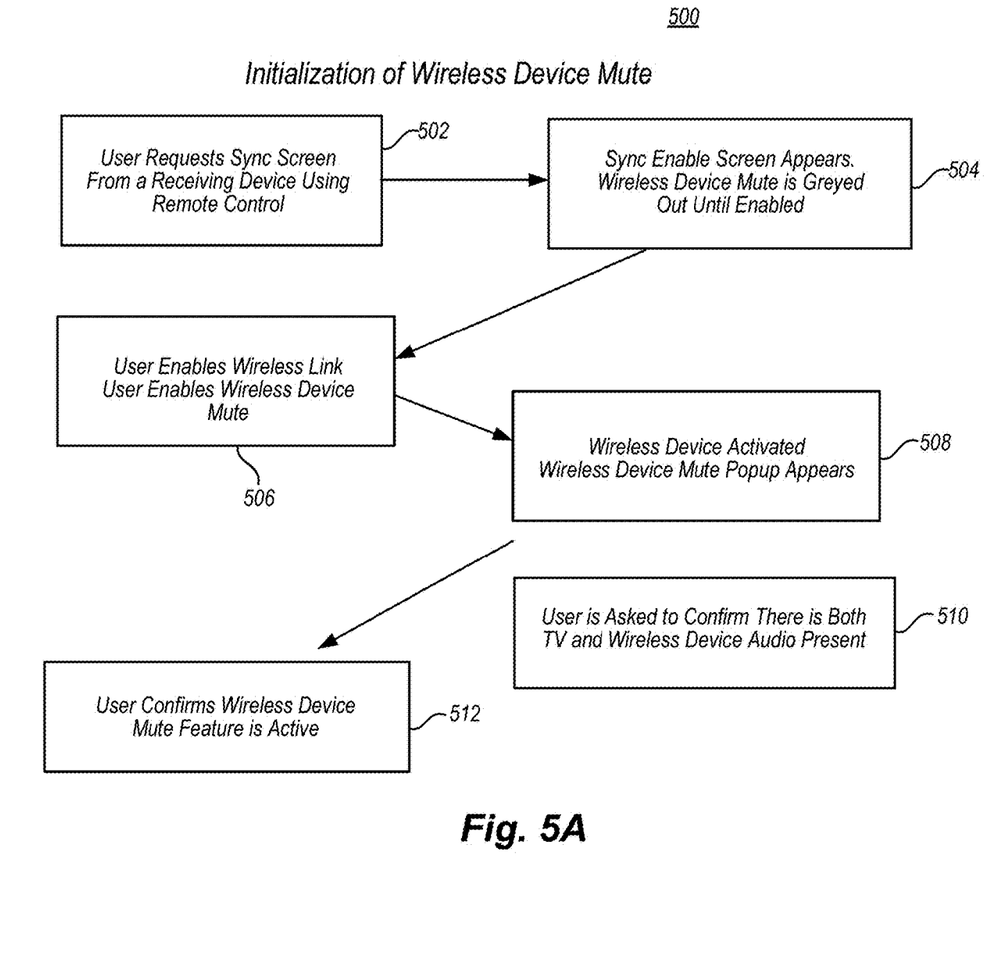
FIGS. 5A-5D show embodiments of mute mechanisms between a receiving device and at least one audio output device.

FIG. 5A illustrates one non-limiting embodiment of an initialization of a wireless audio output device mute operation flowchart 500. At 502, a user requests a synchronization screen from a receiving device using a remote control. The synchronization screen appears at 504, though a wireless device mute feature is greyed out while the feature is disabled. The user enables a wireless link and the wireless device mute feature at 506, and at 508, the wireless device is activated. Activation of the wireless device causes a wireless device mute popup dialog box to appear. The user is asked to confirm both a television display device and a wireless audio output device are both present at 510, and the user confirms that the wireless device mute feature is active at 512.

Figure 5B:
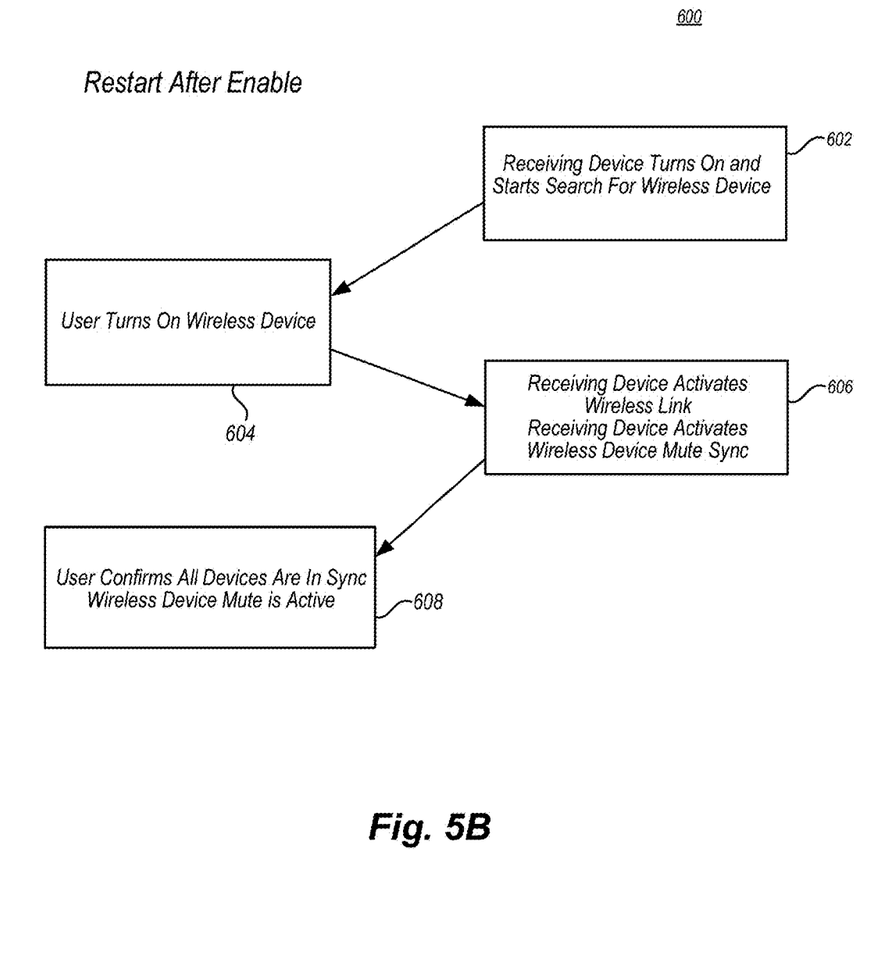

In FIG. 5B, a flowchart illustrates a wireless mute feature is restarted after enable 600. At 602, a receiving device turns on and starts a search for a wireless device. The receiving device will typically broadcast a link signal and wait for wireless audio output devices to respond. At 604, a user turns on the wireless audio output device, and at 606, the logical wireless link is activated. The receiving device subsequently activates the wireless audio output device mute feature synchronization process. A user confirms that all devices are synchronized at 608, and the wireless audio output device mute feature is active. Alternatively, in some embodiments, whenever a receiving device forms a new logical communications link with a wireless audio output device, all audio output devices are synchronized to a same state; un-muted for example.

Figure 5C:
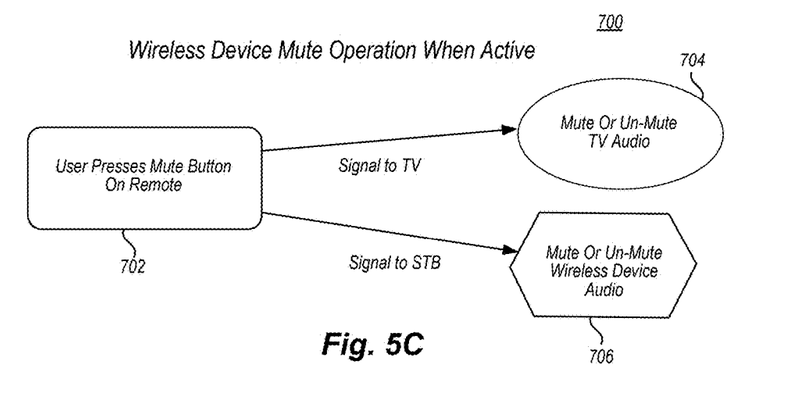

FIG. 5C presents a wireless device mute operation when active flowchart 700. A user presses a mute button on a remote control device at 702. Processing proceeds to one or both 704 and 706. At 704, a signal is sent to a television display device. The signal is alternately a mute or an un-mute signal. The signal may be sent from the remote control or from the receiving device. At 706, the mute signal or alternately the un-mute signal is sent to the receiving device. The receiving device mutes or un-mutes the audio data sent to a wireless audio output device.

Figure 5D:
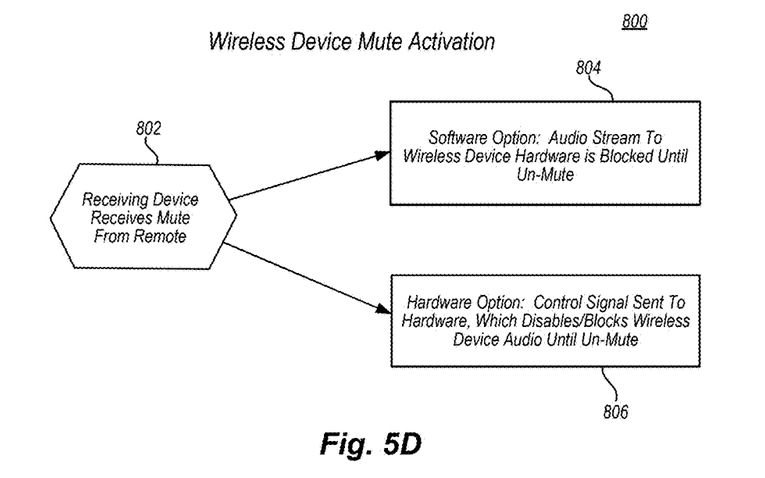

FIG. 5D is a wireless device mute activation flowchart 800. A receiving device receives a mute command from a remote control at 802. The system provides a software implementation at 804 and a hardware implementation at 806. The system may provide the software solution, the hardware solution, or a combination of software and hardware solutions. At 802, in the software option, the audio date stream to a wireless audio output device is blocked until an un-mute command is received. At 806, in the hardware option, a control signal is sent to a circuit to disable or otherwise block a wireless audio output device until an un-mute command is received.

In the present disclosure, reference is made to a mute function and to an un-mute function. It is understood in the embodiments described herein, where a mute operation is described, a complementary un-mute function is also considered and vice versa. In some or all of the embodiments, the mute and un-mute functions may be carried out using a single input structure such that when audio output is "on," an activation of the input toggles the audio output "off," and when audio output is "off," an activation of the input toggles the audio output "on." Alternatively, two or more input structures to control the mute and un-mute functions are also considered.

The flowcharts of FIGS. 5A-5E illustrate one or more processes described in detail in the disclosure herein. The processes may be used by embodiments of a system that includes wireless audio output devices such as Bluetooth-compliant headsets, receiving devices such as a set top box, television display devices, remote control devices, and other devices. In this regard, each described process may represent a module, segment, or portion of code, which comprises one or more executable instructions for implementing the specified logical function(s). It should also be noted that in some implementations, the functions noted in the process may occur in a different order, may include additional functions, may occur concurrently, and/or may be omitted. The processes may be implemented in a single integrated circuit or in a device having many integrated circuits.

FIGS. 1, 2, and 4 illustrate portions of non-limiting embodiments of electronic devices. The devices include operative hardware found in a conventional electronic apparatuses including processing units such as one or more central processing units (CPU's) and/or digital signal processors (DSP's), volatile and non-volatile memory, communication bus architectures, serial and parallel input/output (I/O) circuitry compliant with various standards and protocols, wired and/or wireless networking circuitry (e.g., a communications transceiver), and the like.

As known by one skilled in the art, devices discussed herein may have one or more memories (e.g., memory 60 of FIG. 2), and each memory comprises any combination of volatile and non-volatile computer-readable media for reading and writing. Volatile computer-readable media includes, for example, random access memory (RAM). Non-volatile computer-readable media includes, for example, read only memory (ROM), magnetic media such as a hard-disk, an optical disk drive, a flash memory device, a CD-ROM, and/or the like. In some cases, a particular memory is separated virtually or physically into separate areas, such as a first memory, a second memory, a third memory, etc. In these cases, it is understood that the different divisions of memory may be in different devices or embodied in a single memory. The memory in some cases is a non-transitory computer medium configured to store software instructions arranged to executed by a processing unit.

The devices discussed herein may further include operative software found in a conventional computing devices such as an operating system, software drivers to direct operations through I/O circuitry, networking circuitry, and other peripheral component circuitry. In addition, the devices may include operative application software such as network software for communicating with other computing devices, database software for building and maintaining databases, and task management software for distributing the communication and/or operational workload amongst various processing units. In some cases, the devices are a single hardware machine having the hardware and software listed herein, and in other cases, the devices are a networked collection of hardware and software machines working together to execute the functions of the receiving device 22 or other devices. Some aspects of the conventional hardware and software of the devices (e.g., buses, power supplies, user input/output circuits, operating systems, device drivers, and more) are not shown in the figures for simplicity.

In the foregoing description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with electronic and computing systems including client and server computing systems, as well as networks have not been shown or described in detail to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, e.g., "including, but not limited to."

Reference throughout this specification to "one embodiment" or "an embodiment" and variations thereof means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

The headings and Abstract of the Disclosure provided herein are for convenience only and do not interpret the scope or meaning of the embodiments.

The various embodiments described above can be combined to provide further embodiments. Aspects of the embodiments can be modified and changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A receiving device, comprising:
a wireless transmission circuit arranged to form a first logical communications link between the wireless transmission circuit and a first audio output device and the wireless transmission circuit arranged to form a second logical communications link between the wireless transmission circuit and a second audio output device, the wireless transmission circuit arranged to communicate first audio data to the first audio output device via the first logical communications link and the wireless transmission circuit arranged to communicate second audio data to the second audio output device via the second logical communications link;
a wireless reception circuit arranged to receive user commands;
a first logic circuit arranged to identify a mute command received via the wireless reception circuit;
a second logic circuit arranged to mute the first audio data communicated to the first audio output device while maintaining the first logical communications link, wherein the first audio data is modified to a lower volume of the first audio data that simulates silence after the mute command is identified by the first logic circuit and the first audio data is not modified after an un-mute command is identified by the first logic circuit, and wherein maintaining the first logical communications link includes communicating modified first audio data to the first audio output device via the first logical communications link after the mute command is identified by the first logic circuit; and
a mute synchronization circuit arranged to synchronize a mute operation of the first audio output device and the second audio output device, wherein synchronizing the mute operation includes:
determining, with the mute synchronization circuit, if a mute synchronization status of the first audio output device and the second audio output device is un-synchronized, the un-synchronized mute synchronization status indicating that one of the first audio output device and the second audio output device is muted while the other of the first audio output device and the second audio output device is un-muted;
if the mute synchronization status is determined to be un-synchronized, requesting user assistance to determine the mute synchronization status; and
based on the user assistance, muting both the first audio output device and the second audio output device or un-muting both the first audio output device and the second audio output device.

2. The receiving device of claim 1 wherein the wireless transmission circuit conforms to a Bluetooth standard.

3. The receiving device of claim 1 wherein the wireless reception circuit is arranged to receive signals from a remote control device according to a ZigBee protocol.

4. The receiving device of claim 1 wherein the first audio output device is a headset.

5. The receiving device of claim 1 wherein the wireless transmission circuit is arranged to concurrently form a separate logical communications link with each of a plurality of audio output devices.

6. The receiving device of claim 1 wherein the second audio output device is a display device, the display device associated with the receiving device, and wherein the mute synchronization circuit is arranged to concurrently mute sound from the first audio output device and the display device.

7. The receiving device of claim 6 wherein sound from the first audio output device and sound from the display device is muted based on a single mute command received via the wireless reception circuit.

8. The receiving device of claim 6 wherein sound from the first audio output device and sound from the display device share a common volume control.

9. The receiving device of claim 6 wherein sound from the first audio output device and sound from the display device have different volume controls.

10. The receiving device of claim 1 wherein the second audio data is suspended from communication to the second audio output device after the mute command is identified by the first logic circuit and the second audio data is communicated to the second audio output device after an un-mute command is identified by the first logic circuit.

11. The receiving device of claim 1 wherein the first audio data is associated with television programming.

12. The receiving device of claim 1 wherein modification of the first audio data to simulate silence includes altering the audio data to produce a moderately varying silence.

13. A Bluetooth transceiver control device formed in a single integrated circuit, comprising:
a first control circuit arranged to form a first logical communications link with a first slave device and the first control circuit arranged to form a second logical communications link with a second slave device;
a communication circuit arranged to pass first audio data to the first slave device via the first logical communications link and the communication circuit arranged to pass second audio data to the second slave device via the second logical communications link;
a second control circuit arranged to receive a mute command;
a third control circuit arranged to mute the first audio data from transmission to the first slave device while maintaining the first logical communications link by continuing to transmit the first audio data to the first slave device, wherein muting the first audio data includes modifying the first audio data to a lower volume of the first audio data that simulates silence after the mute command is received and not modifying the first audio data after an un-mute command is received; and
a mute synchronization circuit arranged to synchronize a mute operation of the first slave device and the second slave device, wherein synchronizing the mute operation includes:
determining, with the mute synchronization circuit, if a mute synchronization status of the first slave device and the second slave device is un-synchronized, the un-synchronized mute synchronization status indicating that one of the first slave device and the second slave device is muted while the other of the first slave device and the second slave device is un-muted;

if the mute synchronization status is determined to be un-synchronized, requesting user assistance to determine the mute synchronization status; and based on the user assistance, muting both the first slave device and the second slave device or un-muting both the first slave device and the second slave device.

14. The Bluetooth transceiver control device of claim 13, comprising:

an audio interface arranged to receive audio data; and a serial port arranged to receive control information, the control information including information associated with the mute command.

15. The Bluetooth transceiver control device of claim 13 wherein the first control circuit is arranged to form logical communications links with a plurality of slave devices.

16. A method to communicate audio data, comprising:

forming, respectively, first and second Bluetooth logical communications links to first and second audio output devices via a wireless transmission circuit;

communicating, respectively, first and second audio data to the first and second audio output devices via the first and second Bluetooth logical communications links;

receiving a mute command;

muting the first audio data from communication to the first audio output device based on the mute command, wherein muting the first audio data includes modifying the first audio data to a lower volume of the first audio data that simulates silence after the mute command is received and not modifying the first audio data after an un-mute command is received;

maintaining the first Bluetooth logical communications link during the muting by continuing to communicate the modified first audio data to the first audio output device via the first Bluetooth logical communications link during the muting; and synchronizing a mute operation of the first and second audio output devices with a mute synchronization circuit, wherein synchronizing the mute operation includes:

determining if a mute synchronization status of the first and second audio output devices is un-synchronized, the un-synchronized mute synchronization status indicating that one of the first and second audio output devices is muted while the other of the first and second audio output devices is un-muted;

if the mute synchronization status is determined to be un-synchronized, requesting user assistance to determine the mute synchronization status; and based on the user assistance, muting both the first and second audio output devices or un-muting both the first and second audio output devices.

17. The method to communicate audio data of claim 16, comprising:

muting the second audio data from communication to the second audio output device based on the mute command; and maintaining the second Bluetooth logical communications link during the muting.

18. The method to communicate audio data of claim 16, comprising:

communicating, via a receiving device, the first audio data to a display device coupled to the receiving device; and muting the first audio data from communication to the display device based on the mute command.

19. The method to communicate audio data of claim 18, comprising:

synchronizing the muting of the first audio data from communication to the first audio output device with the muting of the first audio data to the display device.

* * * * *